(12) United States Patent
Yen

(10) Patent No.: US 7,242,507 B2
(45) Date of Patent: Jul. 10, 2007

(54) ELECTROMAGNETIC WAVE ABSORPTIVE FILM AND ITS FABRICATION

(76) Inventor: Li-Hsien Yen, 5F., No.8, Alley 9, Lane 81, Yongye Rd., Sindian City, Taipei County 231 (TW)

( * ) Notice: Subject to any disclaimer, the term of this patent is extended or adjusted under 35 U.S.C. 154(b) by 0 days.

(21) Appl. No.: 11/205,056

(22) Filed: Aug. 17, 2005

(65) Prior Publication Data

US 2007/0041072 A1     Feb. 22, 2007

(51) Int. Cl.
*G02F 1/03* (2006.01)
(52) U.S. Cl. ...................................... 359/244
(58) Field of Classification Search ................ 359/244, 359/245; 430/200, 964; 428/328, 329, 402, 428/403, 404; 174/35 R, 35 MS
See application file for complete search history.

(56) References Cited

U.S. PATENT DOCUMENTS 6,805,817 B2 * 10/2004 Zhang et al. ............... 252/589
7,091,661 B2 * 8/2006 Ouderkirk et al. .......... 313/512

\* cited by examiner

*Primary Examiner*—Ricky Mack
*Assistant Examiner*—Tuyen Tra
(74) *Attorney, Agent, or Firm*—Rosenberg, Klein & Lee

(57) ABSTRACT

An electromagnetic wave absorptive film for absorbing electromagnetic waves by means of destructive interference is disclosed to include a compound layer, which has single-layer and/or double-layer wave-absorbing and/or wave reflecting grains embedded therein and a thickness equal to $\frac{1}{4}n$ times of the wavelength of the electromagnetic wave to be absorbed, and a reflective layer, which is covered on one side of the compound layer and has a refractive index greater than the compound layer.

21 Claims, 6 Drawing Sheets

ELECTROMAGNETIC WAVE ABSORPTIVE FILM AND ITS FABRICATION

BACKGROUND OF THE INVENTION

1. Field of the Invention

The present invention relates to EMI protective materials and more particularly, to an electromagnetic wave absorptive film that absorbs electromagnetic waves by means of destructive interference. The invention relates also to the fabrication of such an electromagnetic wave absorptive film.

2. Description of the Related Art

Following fast development of high technology, a variety of computers and digitalized communication apparatus and consumer electronic products have been disclosed and have appeared on the market. It is the market trend to make electronic products of relatively higher frequency. In consequence, consumers have a high chance of exposing the body to the harm of electromagnetic waves that may result in a high risk of leukaemia, encephalophyma, DNA destructive disease, and other diseases. According to studies, electromagnetic waves over 60 Hz become harmful to DNA in human cells. Some other foreign studies indicate influences of a cellular telephone to human brain such as temporary memory loss, lowering of the ability of behavior, etc. Because bad effects of electromagnetic waves have been continuously discovered, it has become the major research object in different fields to find electromagnetic wave protective materials.

Regular electromagnetic wave protective materials include electric field shielding materials and magnetic field shielding materials. Further, there are EMI (electromagnetic interference) protective materials prepared from mixture of metal fibers and other natural and synthetic fibers. Organic compound materials may be coated on a variety of materials such as metals, plastics, magnesium alloy, titanium alloy, aluminum alloy, wood, ceramics to change their surface characteristics, achieving EMI protective function.

However, conventional EMI protective materials commonly have a certain thickness that limits the application range. Nowadays, it is the market trend to develop cellular telephones and other electronic products having light, thin, short and small characteristics. When conventional EMI protective materials are used in small mobile electronic products, electromagnetic waves will still leak.

Therefore, it is desirable to provide an electromagnetic absorptive film that eliminates the aforesaid problems.

SUMMARY OF THE INVENTION

The present invention has been accomplished under the circumstances in view. It is one object of the present invention to provide an electromagnetic wave absorptive film and its fabrication method, which utilizes the wave characteristic of phase offset to destruct and absorb electromagnetic waves in the structure of the film.

It is another object of the present invention to provide an electromagnetic wave absorptive film and its fabrication method, which has a thin thickness practical for use in any of a variety of products to effectively absorb electromagnetic waves.

It is still another object of the present invention to provide an electromagnetic wave absorptive film and its fabrication method, which eliminates the installation of grounding without causing electric connection.

To achieve these and other objects of the present invention, the electromagnetic wave absorptive film comprises a compound layer, which has grains embedded therein and a thickness equal to $\frac{1}{4}n$ times of the wavelength of the electromagnetic wave to be absorbed, and a reflective layer, which is covered on one side of the compound layer and has a refractive index greater than the compound layer. Further, the electromagnetic wave absorptive film fabrication method comprises the steps of (1): preparing a molten polymer; (2): mixing grains into the molten polymer; (3): shape-forming the mixture of the molten polymer and the grains to form a compound layer that has a thickness equal to $\frac{1}{4}n$ times of the wavelength of the electromagnetic wave to be absorbed; and (4): forming a reflective layer of refractive index greater than the compound layer on one side of the compound layer.

DETAILED DESCRIPTION OF THE PREFERRED EMBODIMENT

An electromagnetic wave absorptive film in accordance with the present invention utilizes destructive interference to absorb electromagnetic waves. The so-called destructive interference is to have two reversed wave trains of same wavelength meet each other, enabling the peaks of one wave train to be respectively overlapped on the wave troughs of another wave train, and therefore the two wave trains are neutralized.

Figure 1:
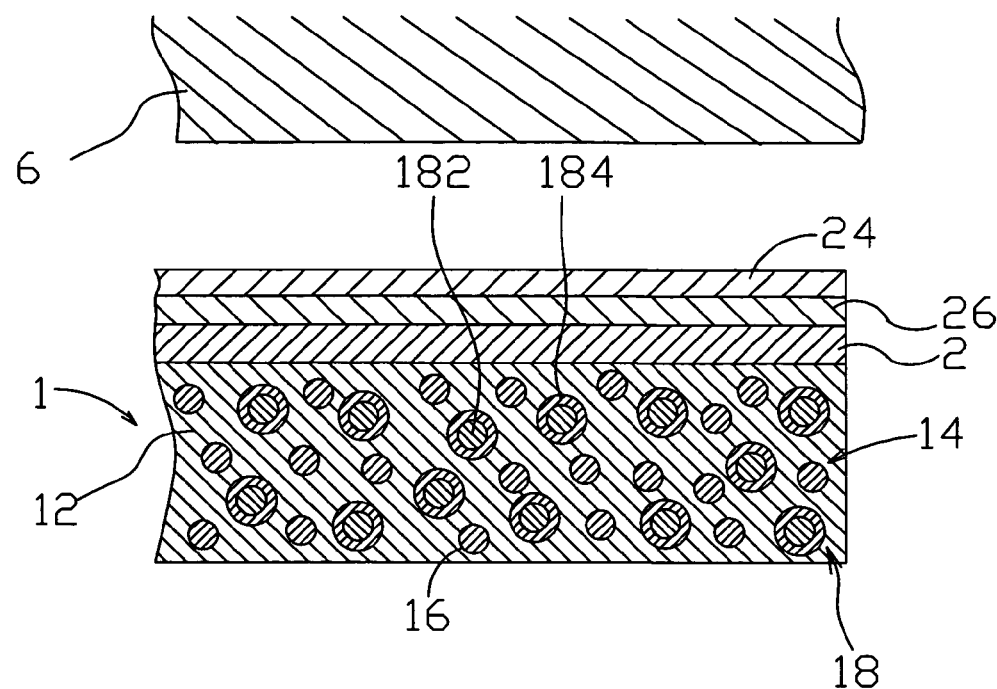
FIG. 1 is a schematic drawing showing the relationship between an electromagnetic wave absorptive film and a product 6 to be shield.

FIG. 1 is a schematic drawing showing the relationship between an electromagnetic wave absorptive film and a product 6 to be shield. As illustrated, the electromagnetic wave absorptive film comprises a compound layer 1 and a reflective layer 2 covered on one side, namely, the top side of the compound layer 1. The compound layer 1 is comprised of a carrier 12, and grains 14 embedded in the carrier 12. The carrier 12 is prepared from a polymeric material. The thickness of the compound layer 1 meets the requirement for destructive interference, i.e., $\frac{1}{4}n$ times of the wavelength of the electromagnetic wave to be absorbed, in which n is a natural number, such that when the incident wave is refracted by an obstacle, the refracted wave traveling course is ½n times of the wavelength. When the difference between the forward and refracted traveling courses is ½n times of the wavelength, the peaks of the refracted wave train will be overlapped on the wave troughs of the forward wave train, thereby causing the wave trains to be neutralized.

Figure 2:
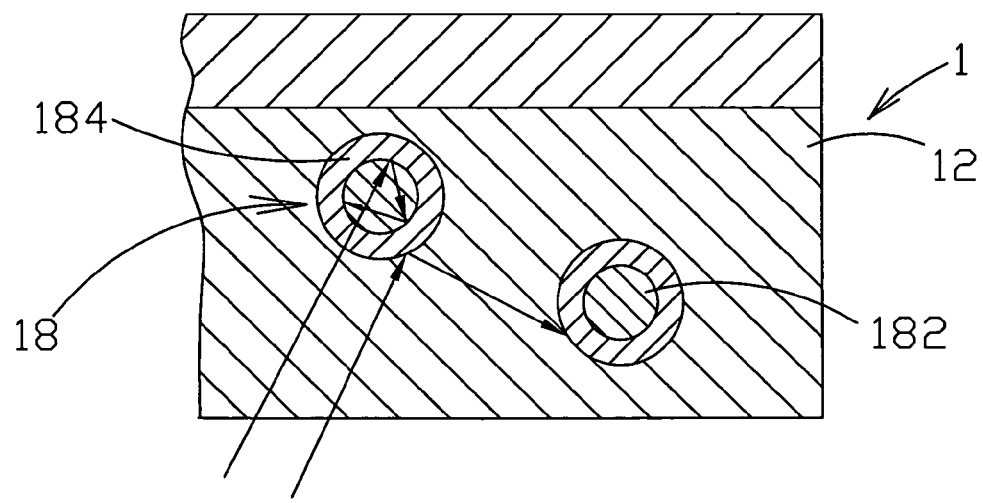
FIG. 2 is a schematic drawing showing reflective and absorptive actions of a double-layer reflecting grain in the compound layer of the electromagnetic wave absorptive film according to the present invention.

The aforesaid grains 14 can be reflecting grains 6, including single-layer reflecting grains 16 and double-layer reflecting grains 18. A double-layer reflecting grain 18 comprises an inner layer of wave-absorbing material 182 and an outer layer of wave-reflecting material 184, as shown in FIG. 2. The inner layer of wave-absorbing material 182 can be obtained from silicon carbide, Porphyries Andesite, infrared ceramics, tourmaline, etc. The outer layer of wave-reflecting material 184 can be metal. When an incident electromagnetic wave encountered a double-layer reflecting grain 18, the part of the incident electromagnetic wave of relatively lower energy will be reflected by the outer layer of wave-reflecting material 184 toward a second double-layer reflecting grain 18, and a part of the reflected electromagnetic wave of relatively lower energy will be reflected by the outer layer of wave-reflecting material 184 of the second double-layer reflecting grain 18 toward a third double-layer reflecting grain 18, and so on, acting similar to a revetment or bulkhead, thereby causing the reflected electromagnetic waves to be neutralized. The other part of the incident electromagnetic wave of relatively stronger energy will be absorbed by the inner layer of wave-absorbing material 182 of the firstly encountered double-layer reflecting grain 18, and the part of the incident electromagnetic wave that passes through the firstly encountered double-layer reflecting grain 18 has the energy thereof greatly attenuated and will then be reflected by the outer layer of wave-reflecting material 184 of another double-layer reflecting grain 18. Through repeated reflecting and absorbing actions, the incident electromagnetic wave will soon be neutralized.

Figure 3:
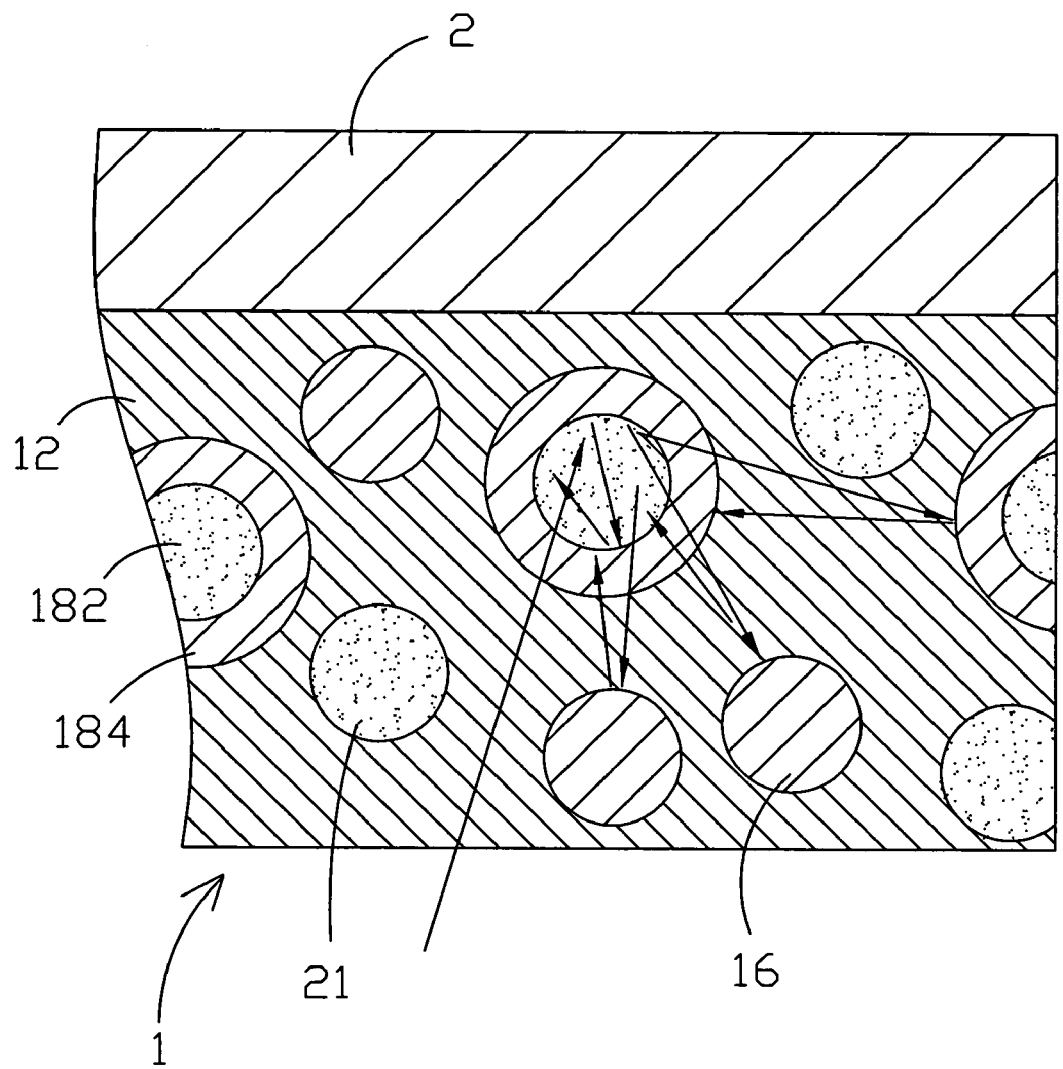
FIG. 3 is a schematic drawing showing single-layer wave-reflecting grains, double-layer wave-reflecting grains and single-layer wave-absorbing grains embedded in the carrier of the compound layer of the electromagnetic wave absorptive film according to the present invention.

The aforesaid grains 14 include wave-absorbing grains 21 formed of wave-absorbing material, i.e., the compound layer 1 has as shown in FIG. 3. The compound layer 1 has wave-absorbing grains 21, single-layer reflecting grains 16 and double-layer reflecting grains 18 embedded in the carrier 12 thereof, forming a honeycomb structure. This design eliminates the possibility of electric connection of the single-layer reflecting grains 16 due to a high installation density of the single-layer reflecting grains 16.

Figure 4:
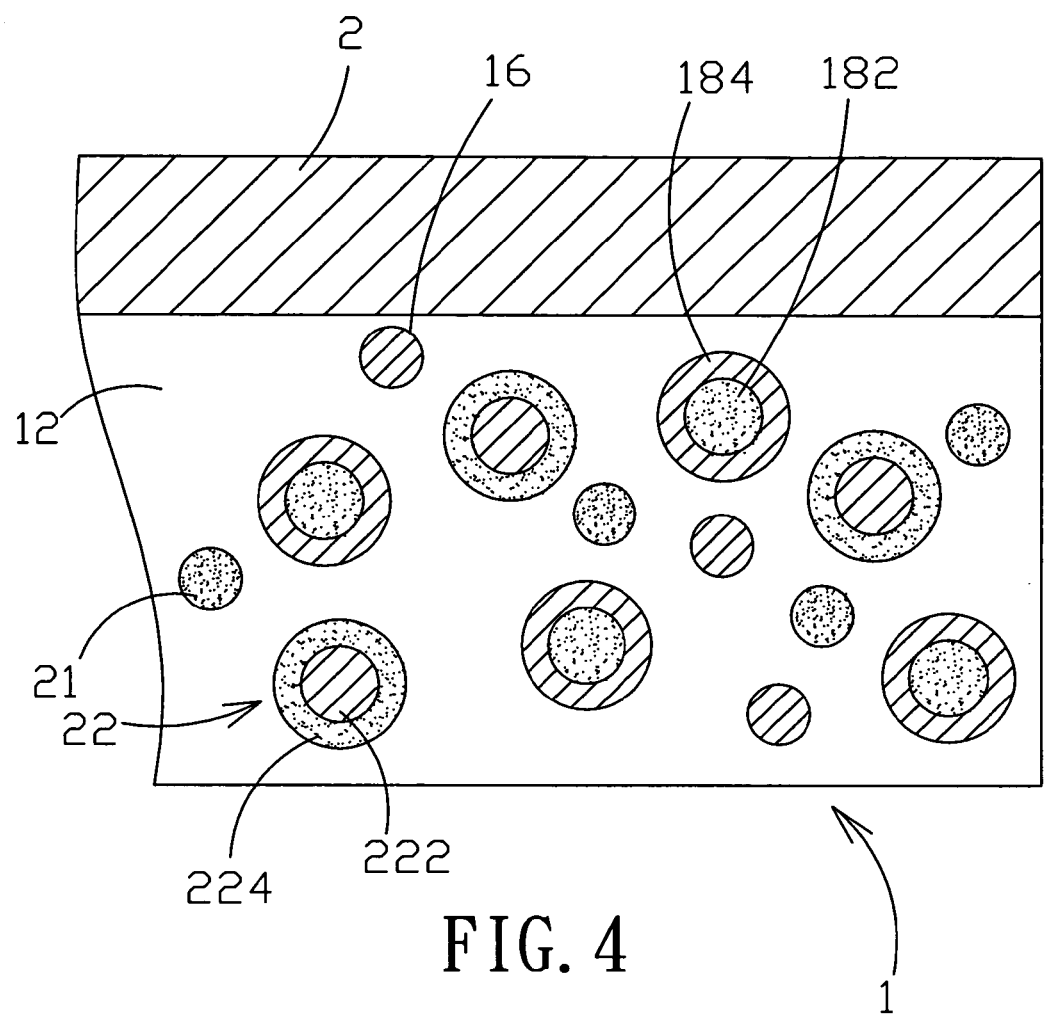
FIG. 4 is a schematic drawing showing single-layer wave-reflecting grains, double-layer wave-reflecting grains, single-layer wave-absorbing grains and double-layer wave-absorbing grains embedded in the carrier of the compound layer of the electromagnetic wave absorptive film according to the present invention.

Referenced to the FIG. 4, the wave-absorbing grains 21 of the invention may be a double-layer wave-absorbing grain 22. The double-layer wave-absorbing grain 22 comprises an inner layer of wave-reflecting material 222 obtained from, for example, metal, and an outer layer of wave-absorbing material 224 obtained from, for example, silicon carbide, Porphyries Andesite, infrared ceramics or tourmaline. When an electromagnetic wave encountered one double-layer wave-absorbing grain 22, the outer layer of wave-absorbing material 224 of the double-layer wave-absorbing grain 22 absorbs the energy of the incident electromagnetic wave, and the inner layer of wave-reflecting material 222 of the one double-layer wave-absorbing grain 22 reflect the attenuated incident electromagnetic wave, enabling the residual energy of the reflected electromagnetic wave to be absorbed by the outer layer of wave-absorbing material 224 of the double-layer wave-absorbing grain 22 again.

The aforesaid various different grains may be independently used and mixed in the polymer carrier of the compound layer to fit different requirements.

The aforesaid reflective layer 2 is provided at the top side of the compound layer 1 for reflecting electromagnetic waves passing through the compound layer 1 back onto the compound layer 1. Therefore, the material of the reflective layer 2 is selected subject to the structure of the carrier 12 of the compound layer 1, enabling the refractive index n1 of the reflective layer 2 to be greater than the refractive index n2 of the carrier 12. This design enables electromagnetic wave to pass from a denser medium to a less dense medium, so as to greatly increase the chance of reflection of electromagnetic wave back to the compound layer 1 under Brewsten angle. Normally, an alloy is used to form the reflective layer 2. The alloy can be formed of aluminum, nickel, iron, cobalt, and copper. Further, a small amount of manganese may be added to the alloy. Alternatively, the reflective layer 2 can be comprised of multiple metal layers including an aluminum layer, a nickel layer, an iron layer, a copper layer and a cobalt layer that are laminated together.

Figure 5:
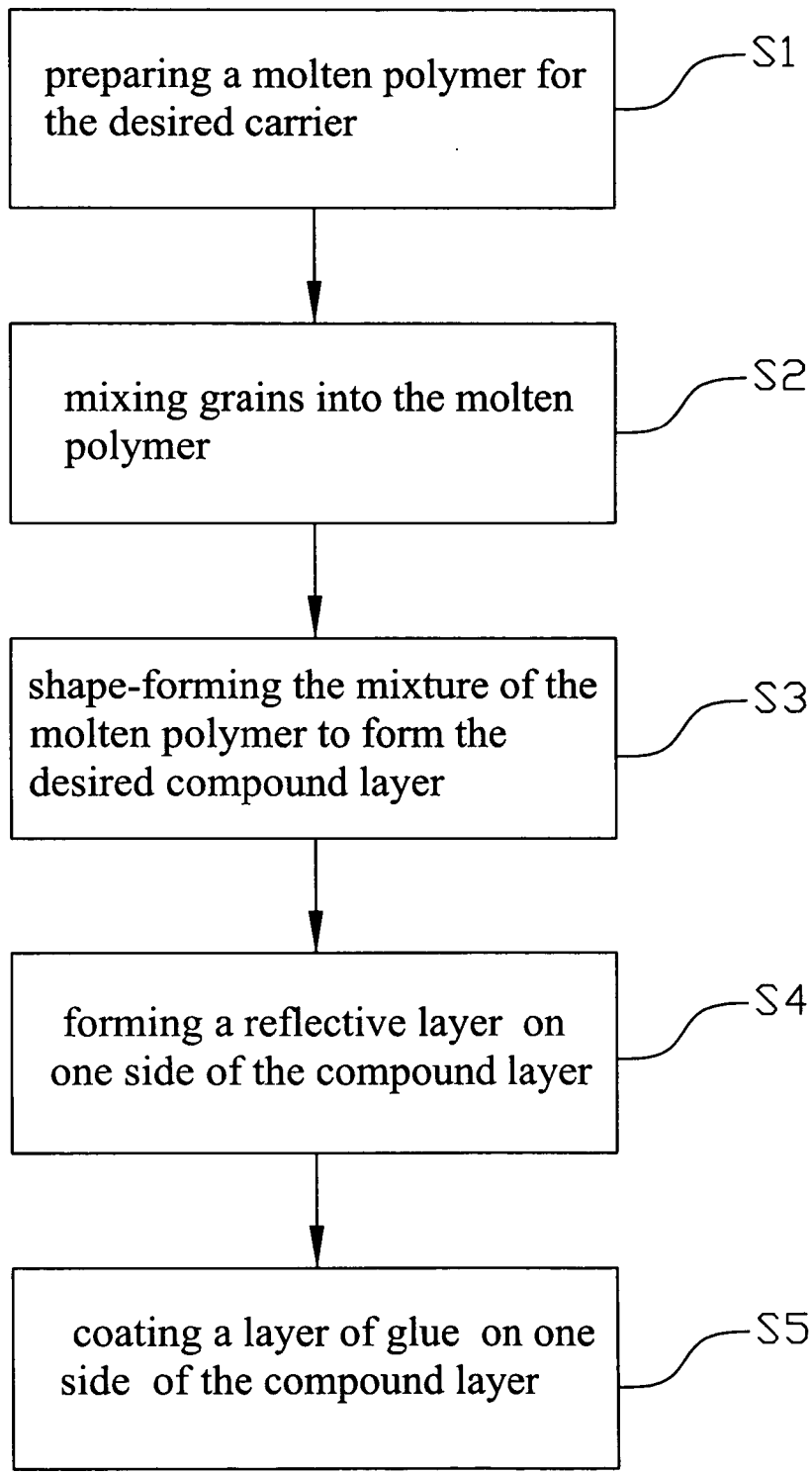
FIG. 5 is an electromagnetic wave absorptive film manufacturing flow chart according to the present invention.

The fabrication of the electromagnetic wave absorptive film is outlined hereinafter with reference to FIG. 5 and FIG. 1 again. This fabrication procedure comprises the steps of:

S1: preparing a molten polymer for the desired carrier 12;

S2: mixing grains into the molten polymer, wherein the grains can be single-layer reflecting grains 16, double-layer reflecting grains 18, wave-absorbing grains 21, double-layer wave-absorbing grains 22, and/or their combination;

S3: shape-forming the mixture of the molten polymer to form the desired compound layer 1 subject to a predetermined thickness through an extruding process; and S4: forming a reflective layer 2 on one side, namely, the top side of the compound layer 1 thus obtained by means of vacuum sputtering or electroplating.

Further, an additional step, namely, step S5 may be employed to coat a layer of glue 24 on the other side, namely, the bottom side of the compound layer 1. Alternatively the layer of glue 24 may be covered on one side of the reflective layer 2 opposite to the compound layer 1 for bonding. Before coating the layer of glue 24 on the reflective layer 2, an electrically insulative layer 26 must be covered on the reflective layer 2 for the bonding of the layer of glue 24 to prevent an electric connection, as shown in FIG. 1.

Figure 6:
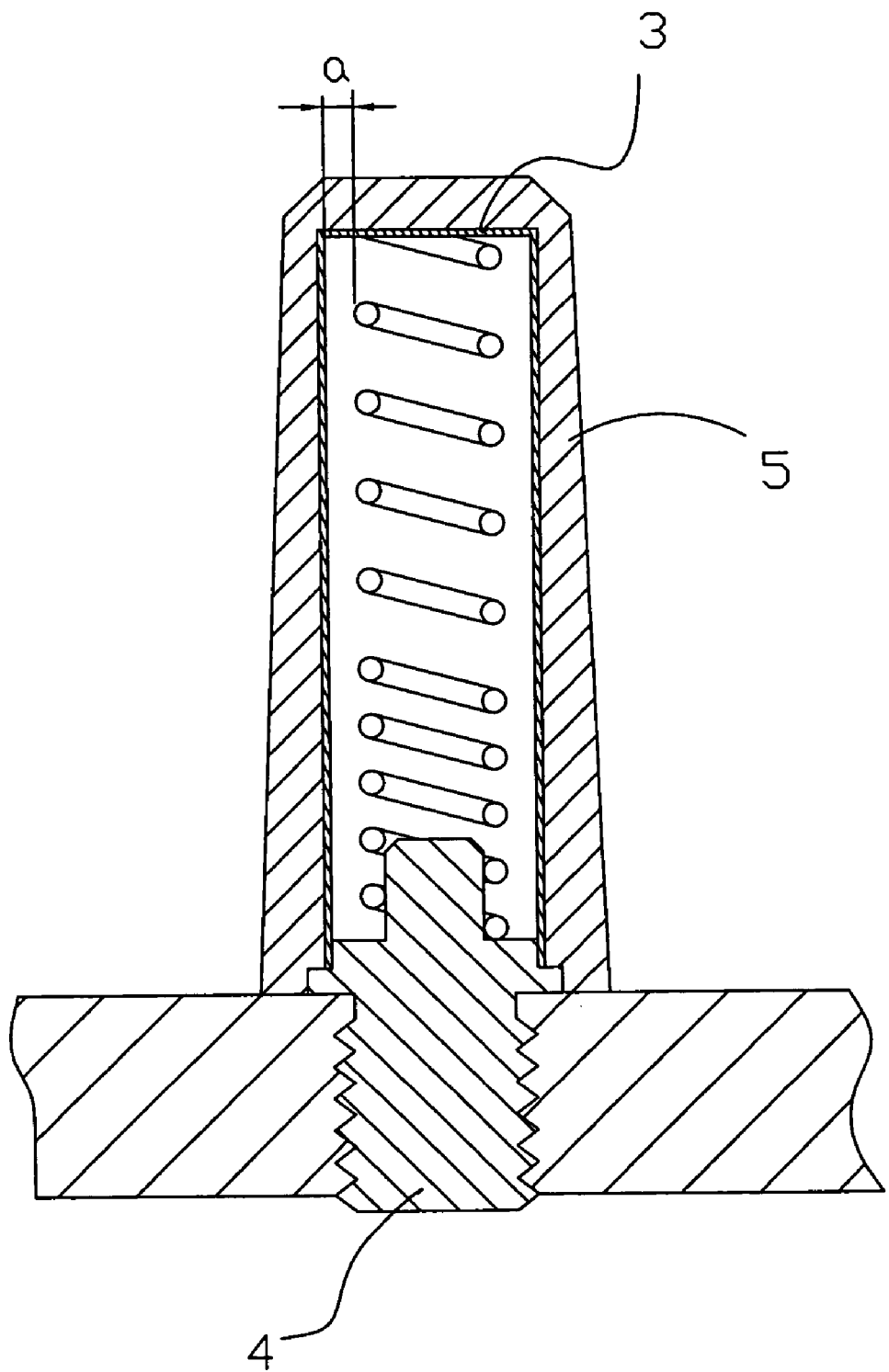
FIG. 6 is a schematic drawing showing an electromagnetic wave absorptive film covered on the antenna of a cellular telephone according to the present invention.

FIG. 6 is an applied view of the present invention, showing the electromagnetic wave absorptive film covered on the antenna of a cellular telephone. Because a cellular telephone sends signal to the base station by radio through the antenna, the antenna is the site where an electromagnetic wave is produced. As illustrated in FIG. 6, the electromagnetic wave absorptive film, referenced by 5, covers the antenna 3 and the fastener 5 that fastens the antenna 3 to the casing of the cellular telephone, leaving a transverse width "a" not shielded for enabling the electromagnetic wave produced by the cellular telephone to pass. This transverse width "a" is a multiple divisible by the wavelength of the electromagnetic wave produced by the cellular telephone. Further, this transverse width "a" extends in direction far from the side to which the user's body may touch.

Figure 7:
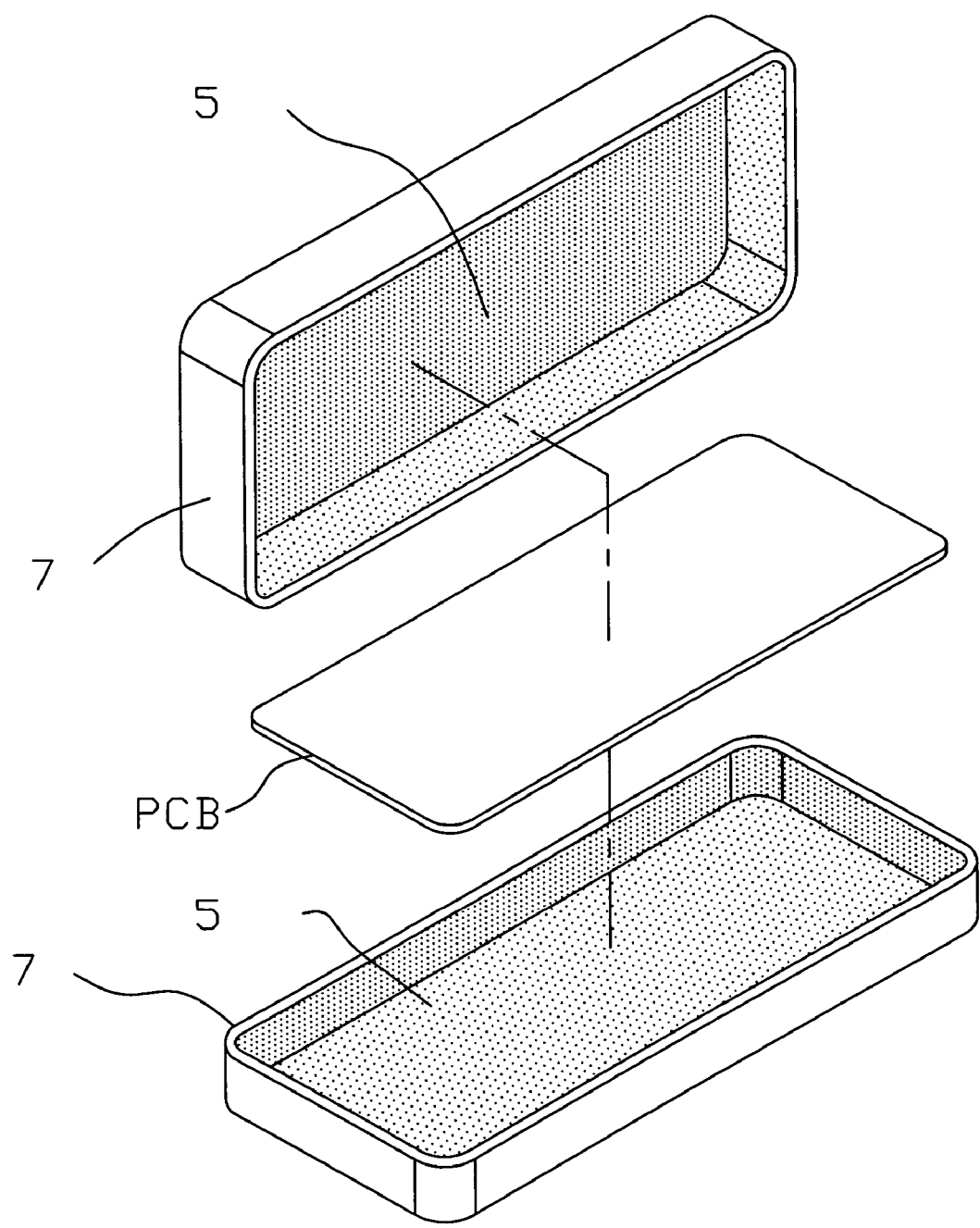
FIG. 7 shows another application example of the present invention.

FIG. 7 shows another application example of the present invention. According to this application example, the electromagnetic wave absorptive film 5 is bonded to the inside wall of the casing 7 of a cellular telephone.

Further, the electromagnetic wave absorptive film 5 may be directly formed on the surface of the component parts of the casing of a cellular telephone to absorb electromagnetic waves. In this case, the reflective layer is formed on the inside wall of the component part at first, and then the compound layer is coated on the reflective layer. A person skilled in the art can achieve this modified method easily.

As indicated above, the invention provides an electromagnetic wave absorptive film, which utilizes wave's phase offset characteristic, wave reflection and wave absorption to neutralize electromagnetic waves, eliminating the complicated grounding arrangement as employed in conventional methods that directly use a metal shield to shield electromagnetic waves. Based on phase offset, one compound layer is sufficient to eliminate electromagnetic waves. Therefore, the invention enables electromagnetic interference protective materials to be made as thin as possible.

Although a particular embodiment of the invention had been described in detail for purposes of illustration, various modifications and enhancements may be made without departing from the spirit and scope of the invention.

The invention claimed is:

1. An electromagnetic wave absorptive film comprising:
    a compound layer, said compound layer having a plurality of grains embedded therein, a thickness equal to (¼)n times of the wavelength of the electromagnetic wave to be destructively interfered, wherein n is natural number; and
    a reflective layer covering one side of said compound layer, said reflective layer having a refractive index greater than said compound layer, whereby all of the electromagnetic waves incident on the reflective layer are reflected back into said compound layer to be scattered by said grains, absorbed, and to combine in a destructive fashion with incident electromagnetic waves so as to reduce re-emission of the incident electromagnetic waves from said absorptive film.

2. The electromagnetic wave absorptive film as claimed in claim 1, wherein said grains include a first portion that are wave-reflecting, a second portion that are absorptive, and a third portion that are double layer grains, said double layer grains each having an absorptive layer and a reflective layer.

3. The electromagnetic wave absorptive film as claimed in claim 1, wherein said grains include wave-reflecting grains, and wave-absorbing grains that have a different diameter relative to said wave-reflecting grains.

4. The electromagnetic wave absorptive film as claimed in claim 3, wherein said wave-absorbing grains each comprise an inner layer of reflecting material and an outer layer of absorbing material surround said inner layer of reflecting material.

5. The electromagnetic wave absorptive film as claimed in claim 1, wherein said grains are wave-absorbing grains.

6. The electromagnetic wave absorptive film as claimed in claim 5, wherein said wave-absorbing grains each comprise an inner layer of reflecting material and an outer layer of absorbing material surrounding said inner layer of reflecting material.

7. The electromagnetic wave absorptive film as claimed in claim 1, wherein said reflective layer is a metal layer.

8. The electromagnetic wave absorptive film as claimed in claim 7, wherein said metal layer is selected from a material group including aluminum, nickel, iron, copper and cobalt.

9. The electromagnetic wave absorptive film as claimed in claim 8, wherein said metal layer is formed on said compound layer by a coating procedure selected from one of the coating methods of vacuum sputtering and electroplating.

10. The electromagnetic wave absorptive film as claimed in claim 1, wherein said compound layer is formed of a polymer.

11. The electromagnetic wave absorptive film as claimed in claim 1, which is covered on the antenna of a cellular telephone, leaving a gap not shielded for enabling the electromagnetic wave produced by the cellular telephone to pass, the size of said gap being a multiple divisible by the wavelength of the electromagnetic wave produced by the cellular telephone.

12. An electromagnetic wave absorptive film comprising:
    a compound layer, said compound layer having a plurality of grains embedded therein, a thickness equal to (¼)n times of the wavelength of the electromagnetic wave to be absorbed, wherein n is a natural number; and
    a reflective layer covering one side of said compound layer, said reflective layer having a refractive index greater than said compound layer, wherein said grains are wave-reflecting grains, and said wave-reflecting grains each comprise an inner layer of absorbing material and an outer layer of reflecting material surrounding said inner layer of absorbing material.

13. An electromagnetic wave absorptive film fabrication method comprising the steps of:
    (1): preparing a molten polymer;
    (2): mixing grains into said molten polymer;
    (3): shape-forming the mixture of said molten polymer and said grains to form a compound layer that has a thickness equal to (¼)n times of the wavelength of the electromagnetic wave to be destructively interfered, wherein n is natural number; and
    (4): forming a reflective layer on one side of said compound layer, said reflective layer having a refractive index greater than said compound layer, whereby all of the electromagnetic waves incident on the reflective layer are reflected back into said compound layer to be scattered by said grains, absorbed, and to combine in a destructive fashion with incident electromagnetic waves so as to reduce re-emission of the incident electromagnetic waves from said absorptive film.

14. The electromagnetic wave absorptive film fabrication method as claimed in claim 13, wherein said grains are selected from single-layer wave-absorbing grains, double-layer wave-absorbing grains, single-layer wave-reflecting grains, double-layer wave-reflecting grains, and/or their combination.

15. The electromagnetic wave absorptive film fabrication method as claimed in claim 14, wherein said double-layer wave-reflecting grains each comprise an inner layer of absorbing material and an outer layer of reflecting material surrounding said inner layer of absorbing material.

16. The electromagnetic wave absorptive film fabrication method as claimed in claim 14, wherein said double-layer wave-absorbing grains each comprise an inner layer of reflecting material and an outer layer of absorbing material surrounding said inner layer of reflecting material.

17. The electromagnetic wave absorptive film fabrication method as claimed in claim 13, wherein said reflective layer is a metal layer.

18. The electromagnetic wave absorptive film fabrication method as claimed in claim 17, wherein said metal layer is selected from a material group including aluminum, nickel, iron, copper and cobalt.

19. The electromagnetic wave absorptive film fabrication method as claimed in claim 17, wherein said metal layer is formed on said compound layer by a coating procedure selected from one of the coating methods of vacuum sputtering and electroplating.

20. The electromagnetic wave absorptive film fabrication method as claimed in claim 13, further comprising the step (5) of covering a layer of electrically insulative material on one side of said reflective layer opposite to said compound layer and a layer of glue on said layer of electrically insulative material opposite to said reflective layer.

21. The electromagnetic wave absorptive film fabrication method as claimed in claim 13, further comprising the step (5) of covering a layer of glue on one side of said compound layer opposite to said absorptive layer.

* * * * *